United States Patent
Lin et al.

(10) Patent No.: US 11,903,300 B2
(45) Date of Patent: Feb. 13, 2024

(54) PIXEL CONFIGURATIONS FOR HIGH RESOLUTION OVJP PRINTED OLED DISPLAYS

(71) Applicant: Universal Display Corporation, Ewing, NJ (US)

(72) Inventors: JinJu Lin, Taichung (TW); Gregg Kottas, Ewing, NJ (US); William E. Quinn, Whitehouse Station, NJ (US)

(73) Assignee: Universal Display Corporation, Ewing, NJ (US)

( * ) Notice: Subject to any disclaimer, the term of this patent is extended or adjusted under 35 U.S.C. 154(b) by 253 days.

(21) Appl. No.: 17/091,212

(22) Filed: Nov. 6, 2020

(65) Prior Publication Data
US 2021/0151717 A1    May 20, 2021

Related U.S. Application Data

(60) Provisional application No. 62/936,760, filed on Nov. 18, 2019.

(51) Int. Cl.
*H10K 71/00* (2023.01)
*H10K 50/125* (2023.01)
*H10K 59/121* (2023.01)

(52) U.S. Cl.
CPC ........... *H10K 71/00* (2023.02); *H10K 50/125* (2023.02); *H10K 59/121* (2023.02)

(58) Field of Classification Search
CPC .................. H01L 51/0005; H01L 51/5012
See application file for complete search history.

(56) References Cited

U.S. PATENT DOCUMENTS

| | | | |
|---|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.

(Continued)

*Primary Examiner* — Jay C Chang
(74) *Attorney, Agent, or Firm* — Butzel Long

(57) ABSTRACT

Methods and OLED devices are provided in which organic emissive materials are deposited over a substrate via OVJP print heads in a continuous line extending from one edge of the active display portion of a substrate to another. The print heads are arranged such that the sidewalls of the OVJP jet are disposed over non-emissive insulating portions of the display panel, thereby allowing for improved pixel density and resolution in comparison to conventional OVJP and similar techniques.

20 Claims, 17 Drawing Sheets

(56) References Cited

U.S. PATENT DOCUMENTS

| | | |
|---|---|---|
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 9,666,652 B2 | 5/2017 | Madigan |
| 10,269,874 B2 | 4/2019 | Madigan |
| 2003/0190794 A1* | 10/2003 | Ohmi ............... H01L 21/2007 257/E21.122 |
| 2003/0230980 A1 | 12/2003 | Forrest |
| 2004/0174116 A1 | 9/2004 | Lu |
| 2005/0087131 A1* | 4/2005 | Shtein ............... H01L 51/0013 427/248.1 |
| 2011/0101398 A1* | 5/2011 | Uchida ............... H10K 71/00 257/98 |
| 2014/0197396 A1* | 7/2014 | Madigan ............ H01L 51/5234 438/34 |
| 2014/0319484 A1* | 10/2014 | Kwon ............... H10K 59/352 257/40 |
| 2015/0303396 A1* | 10/2015 | Freund ............... H01L 51/5056 257/40 |
| 2016/0111674 A1* | 4/2016 | Bae ............... H01L 51/5088 257/40 |
| 2017/0229663 A1 | 8/2017 | Tsai |
| 2018/0019397 A1* | 1/2018 | Kaiser ............... H01L 51/5012 |
| 2018/0309061 A1* | 10/2018 | Chun ............... G06T 11/60 |
| 2019/0221623 A1* | 7/2019 | Kamiyama ......... H01L 51/0021 |
| 2020/0013662 A1* | 1/2020 | Chaji ............... H01L 21/6835 |
| 2021/0028383 A1* | 1/2021 | Manders ............. H01L 51/5284 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

\* cited by examiner

PIXEL CONFIGURATIONS FOR HIGH RESOLUTION OVJP PRINTED OLED DISPLAYS

CROSS-REFERENCE TO RELATED APPLICATIONS

This application is a non-provisional of, and claims the priority benefit of U.S. Patent Application Ser. No. 62/936,760, filed Nov. 18, 2019, the entire contents of which are incorporated herein by reference.

FIELD

The present invention relates to techniques and devices for fabricating organic emissive devices, such as organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

Embodiments disclosed herein provide devices, systems, and techniques for fabricating OLED devices. In an embodiment, an OLED display panel may be fabricated by obtaining a substrate having a non-emissive insulating layer that defines active pixel areas on the substrate, depositing, via an OVJP print head, a first organic emissive material over the substrate in a continuous line extending from a first edge of an active display portion of the substrate to a second edge of the active display portion of the substrate and being deposited over at least a portion of the non-emissive insulating layer and over at least a first portion of the active pixel areas, and depositing, via an OVJP print head, a second organic emissive material different than the first organic emissive material in a continuous line extending from the first edge of the active display portion of the substrate to the second edge of the active display portion of the substrate and over at least the portion of the non-emissive insulating layer that is the same as the portion over which the first organic emissive material is deposited, and over at least a second portion of the active pixel areas that is different than the first portion.

OLED device panels as disclosed herein may include a substrate, a non-emissive insulating layer disposed over the substrate that defines active pixel areas on the substrate, a first organic emissive material disposed over the substrate in a continuous line extending from a first edge of an active display portion of the substrate to a second edge of the active display portion of the substrate and being deposited over at least a portion of the non-emissive insulating layer and over at least a first portion of the active pixel areas, and a second organic emissive material different than the first organic emissive material disposed in a continuous line extending from the first edge of the active display portion of the substrate to the second edge of the active display portion of the substrate and over at least the portion of the non-emissive insulating layer that is the same as the portion over which the first organic emissive material is deposited, and over at least a second portion of the active pixel areas that is different than the first portion.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
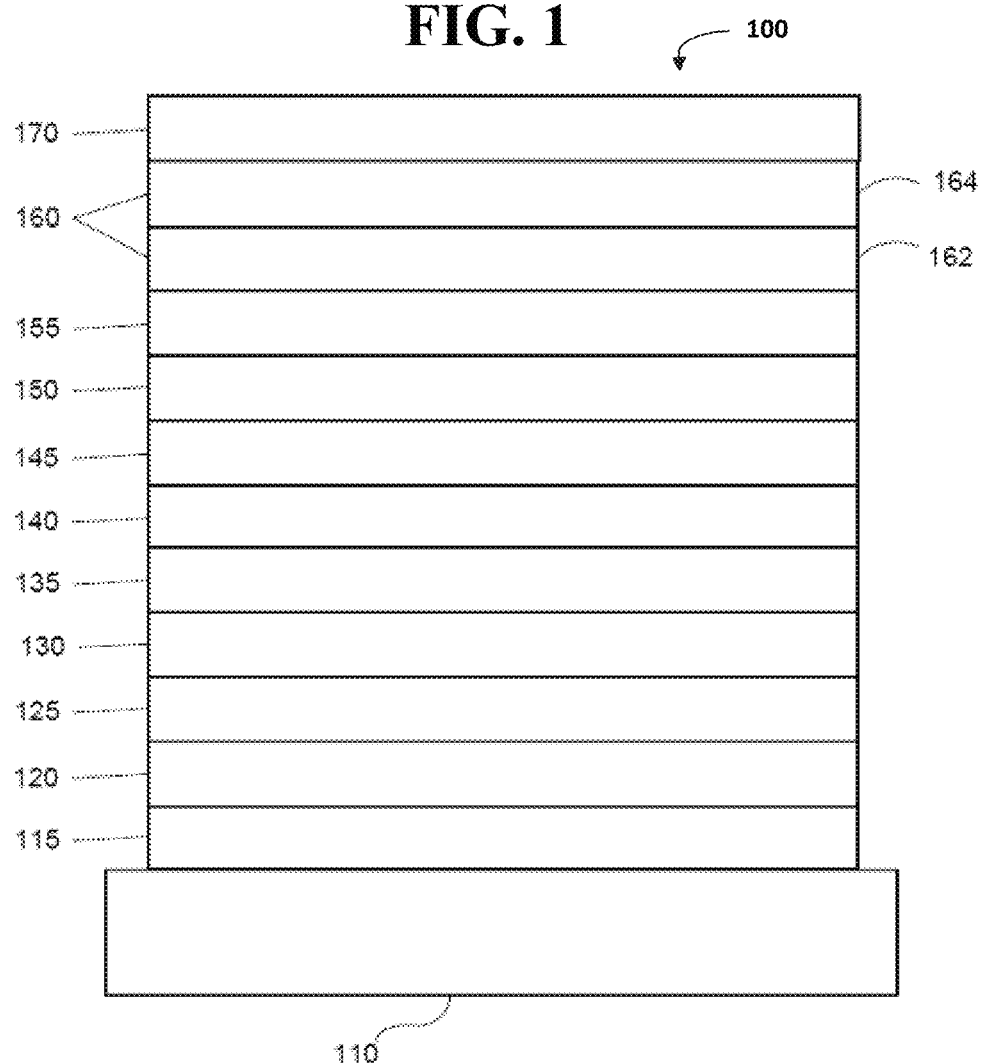
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
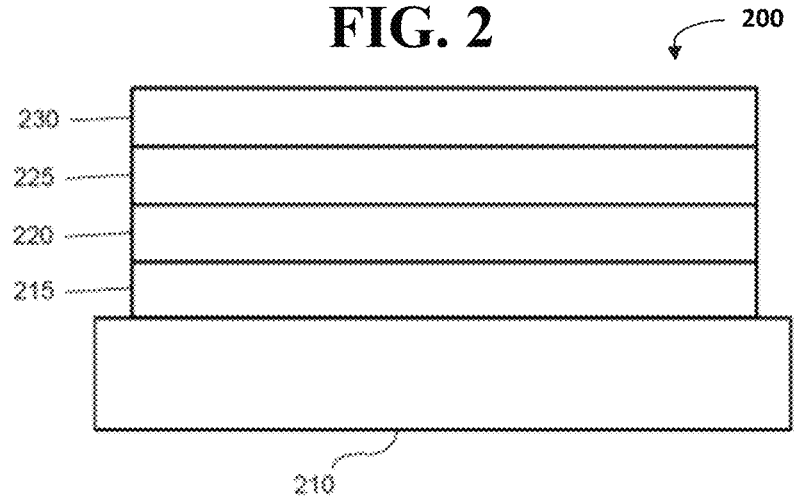
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic As previously disclosed, OVJP techniques use mask-less, solvent-less printing technology to produce side-by-side R-G-B devices such as large-area OLED displays. OVJP typically uses a print head to print lines of OLED material on a patterned backplane substrate. Alternating red, green and blue lines may be separated by a non-emissive insulating layer such as a pixel-defining layer or polyimide grid lines, which may be aligned parallel to the printed organic lines. Individual pixels may be formed by placing transverse grid lines across the parallel grid lines. Resolution of the technique is determined by both the width of the OVJP spray cone, and the width of the grid lines.

Embodiments disclosed herein provide pixel architectures, techniques, and devices that improve the resolution and/or pixel density of resulting devices by using an improved backplane architecture. Photolithography techniques that may be used to pattern the backplane elements may be capable of much higher resolution than conventional OVJP printing techniques. In contrast, embodiments disclosed herein provide techniques to divide OVJP printed pixels into separately-addressable regions to increase display resolution. The architectures disclosed herein relate to OVJP deposited displays and also may be relevant for any line-printing deposition technology. OLED-based devices that include at least two colors of emissive regions are also provided. In some embodiments, one region may be optically coupled to a microcavity and the other is not. Devices including pixels in which only a portion of sub-pixels within the pixel are coupled to a microcavity are provided. In some embodiments, printed sub-pixels may be shared between neighboring pixels by segregating the anode into two or more distinct regions.

Figure 3A:
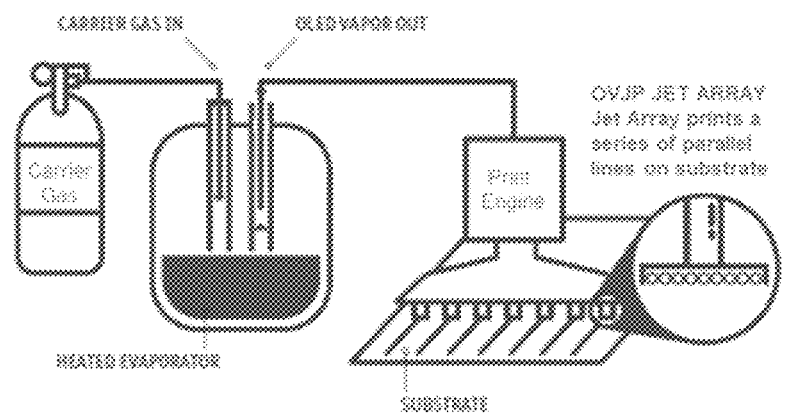
FIG. 3A shows a schematic drawing of an OVJP deposition unit suitable for use with embodiments disclosed herein.
Figure 3B:
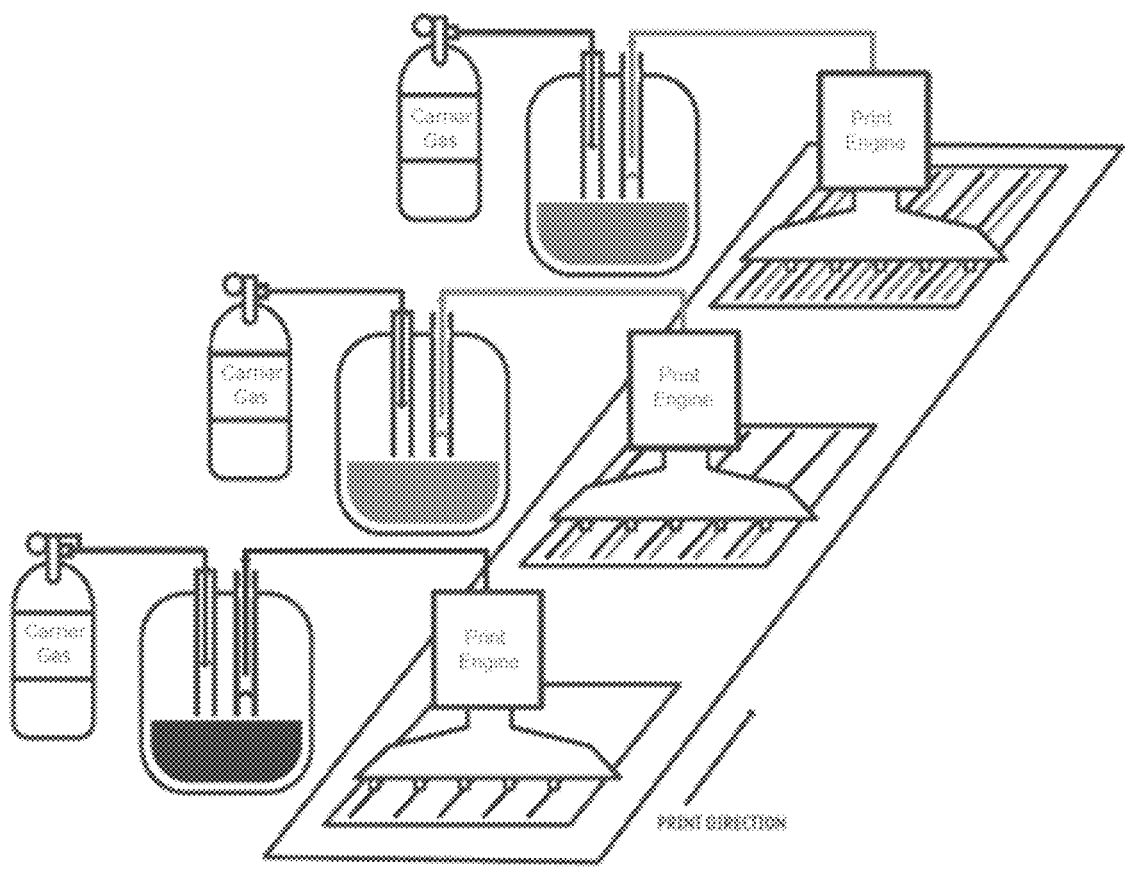
FIG. 3B shows 3 colors of a R-G-B display being printed in one chamber using an OVJP technique.

Advantages of conventional OVJP and OVJP techniques disclosed herein in comparison to other techniques used to manufacture OLED displays are that it does not require fine metal masks, does not use solvents to transport OLED materials, uses standard evaporable materials, and is scalable to large area substrates. FIG. 3A shows a basic OVJP system. The OLED material is placed in sealed, heated containers with an inert gas flowing through the container. OLED material is vaporized and transported to the print engine through heated gas lines. The print engine contains the jet array which prints parallel lines on the substrate which is moving linearly under the jet array. Lines are spaced one pixel-width apart. The material transported to the print engine may be deposited on the surface of the substrate or collected in the print engine such that there is no chamber contamination. Because the process does not contaminate the chamber or internal fixtures, multiple print engines may be contained and operated within a common process chamber. FIG. 3B shows an example in which red, green and blue lines may be printed by separate OVJP print engines in one chamber.

Figure 4A:
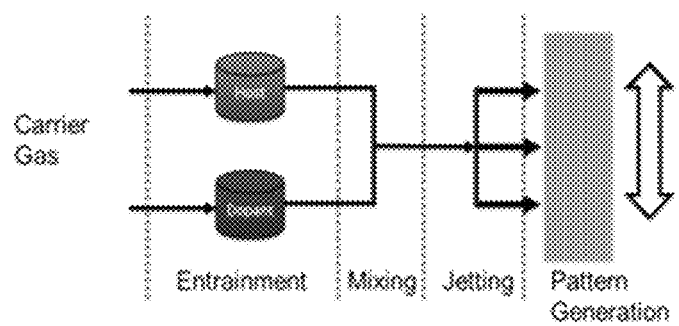
FIG. 4A shows a schematic representation of the main components of an OVJP technique as disclosed herein.
Figure 4B:
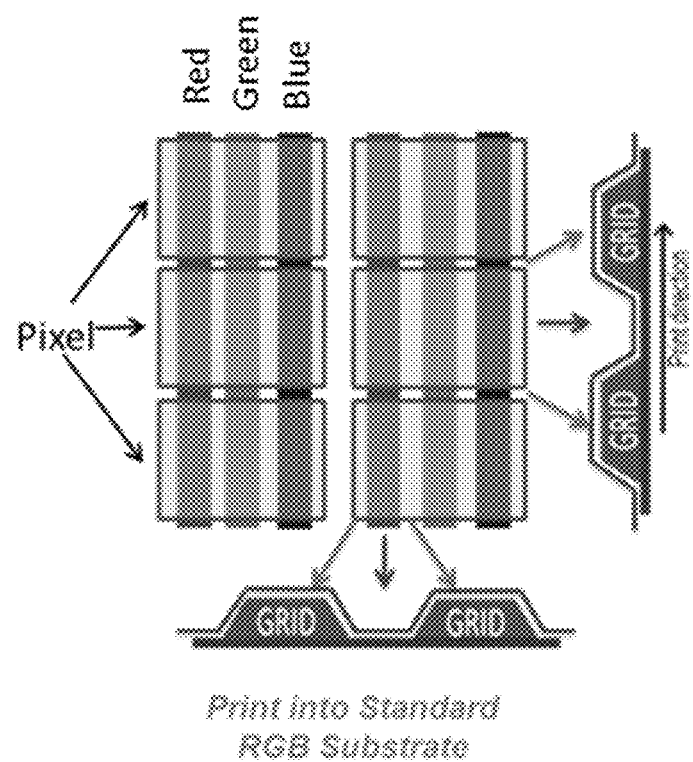
FIG. 4B shows lines of OLED material printed via OVJP overlaying a non-emissive insulating structure such as a pixel-defining layer (PDL) over a backplane as disclosed herein.
Figure 4C:
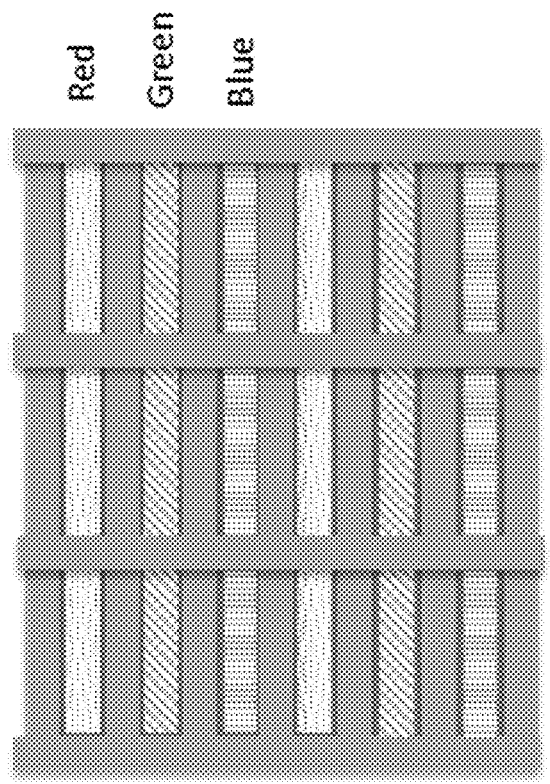
FIG. 4C shows a similar arrangement as in FIG. 4B, where the OLED material lines are split into individual pixels by transverse PDL lines as disclosed herein.

FIGS. 4A-4C show functional details of the techniques disclosed herein. As shown in FIG. 4A, the four key attributes of an OVJP system, including those disclosed herein, are: entrainment, mixing, jetting and pattern generation (or printing). Entrainment takes place in the source containers. OLED materials are heated in sealed containers with carrier gas flowing through each chamber. The system is not limited to two source containers as shown in FIG. 4A, and more generally any number of sources can be connected to the mixing element. For example, multiple emissive materials may be deposited in a single deposition by using source containers that include multiple emissive materials. The flux of organic material from each source container is determined by the source temperature and the carrier gas flow. Gas flows from different sources are combined in the mixing element to provide a uniform concentration of each material in the combined gas flow; for example, in an emissive layer, a host and a dopant would be combined as shown in FIG. 4A. Multiple dopants may be used with a single host by using multiple sources or other combinations of materials may be used. Material is printed on the surface by jetted streams of material that confine the deposited material to narrow lines as the substrate is moved in relation to the jet head. The apertures of the jet head are designed to provide a printed pattern that matches the pixel width and spacing of the display.

FIG. 4B shows an example of a side-by-side red-green-blue (R-G-B) pixel configuration fabricated with an OVJP printing as disclosed herein. In this example, the pixels are arranged so that sub pixels of each color are aligned in straight lines and are separated by a non-emissive insulating pixel defining layer (PDL) arranged in a grid, which typically is a photo-definable polyimide material. As shown in FIGS. 4B and 4C, as disclosed herein the OLED material may be deposited as continuous lines that extend between the vertical PDL and over the horizontal PDL. As a result, pixels may be defined by the deposition of OLED material in the vertical direction and by the PDL in the horizontal direction, as well as by the arrangement of the underlying backplane electronics. In conventional OVJP techniques, the width of the vertical, OVJP-printed line limits the pixel resolution that can be achieved using such a R-G-B-R-G-B pixel repeat pattern. However, as explained in further detail below, techniques disclosed herein may achieve much higher resolutions than may be achieved using conventional OVJP techniques that are strictly limited by the OVJP print width.

Figure 5A:
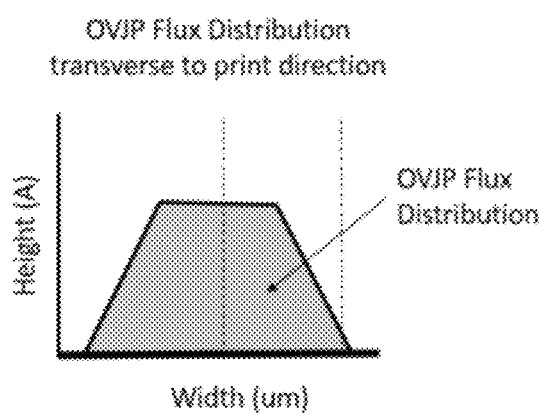
FIG. 5A shows typical flux distribution from an OVJP printing aperture.

FIG. 5A shows a schematic representation of the flux distribution produced by a conventional OVJP print head. The center portion of the example distribution directly under the deposition aperture gives a relatively flat deposition profile. On either side of the flat region, the flux decreases as distance from the edge of the deposition aperture increases. At some distance from the edge of the aperture, the flux becomes zero. This sloped region may be defined as the "sidewall" of the profile of the deposited material. The total deposition width is equal to the center portion plus the two sidewall portions.

Figure 5B:
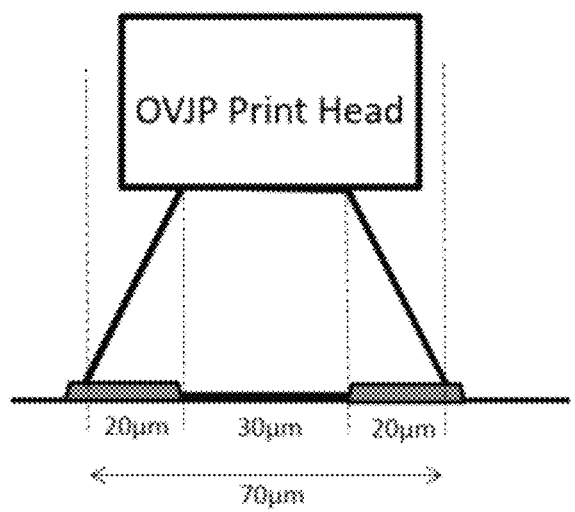
FIG. 5B shows an OVJP print head arranged so that the non-uniform sidewalls of the OVJP distribution fall on the PDL lines separating sub-pixels as disclosed herein.

FIG. 5B shows how the OVJP print head may be arranged relative to the non-emissive insulating PDL grid according to embodiments disclosed herein, such that the center portion of the distribution deposits on the pixel anode 501 and the side walls deposit on the PDL 502. Notably, in the present disclosure it has been realized that because the PDL region is non-emissive, mixing sidewall distributions from neighboring pixels on the PDL does not affect pixel device properties.

In this example, the flat center portion is about 30 μm wide and each sidewall is about 20 μm for a total deposition line width of about 70 μm. More generally, the techniques and pixel architectures disclosed herein may apply to any line printing deposition techniques having cross-sectional deposition patterns with a uniform central region and sloped sidewalls. They may be used with any slope of sidewall, including steeply sloping sidewall profiles such as may be produced by DEC-type (delivery-exhaust-confinement) OVJP systems.

Figure 6A:
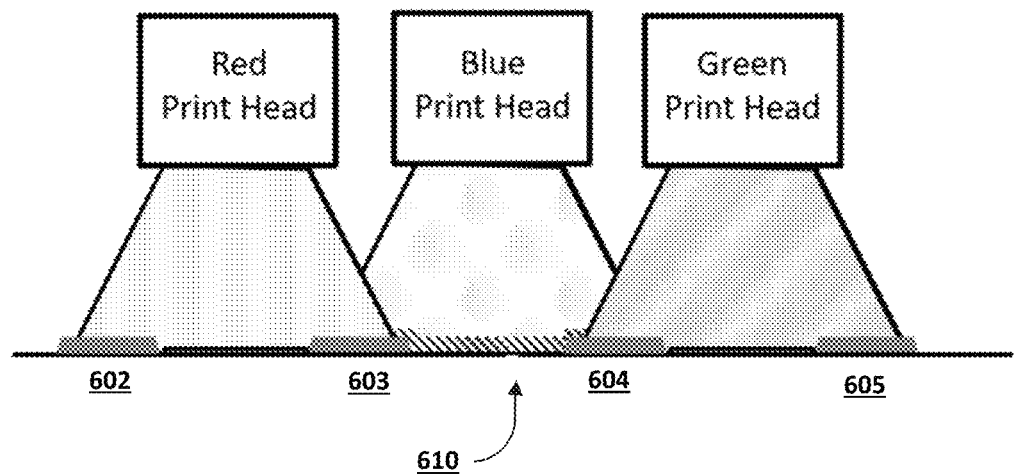
FIG. 6A shows OVJP print heads arranged so that the sidewalls of neighboring sub-pixels depositions fall on the PDL and the uniform central region of the distribution is deposited in the pixel active area as disclosed herein.
Figure 10A:
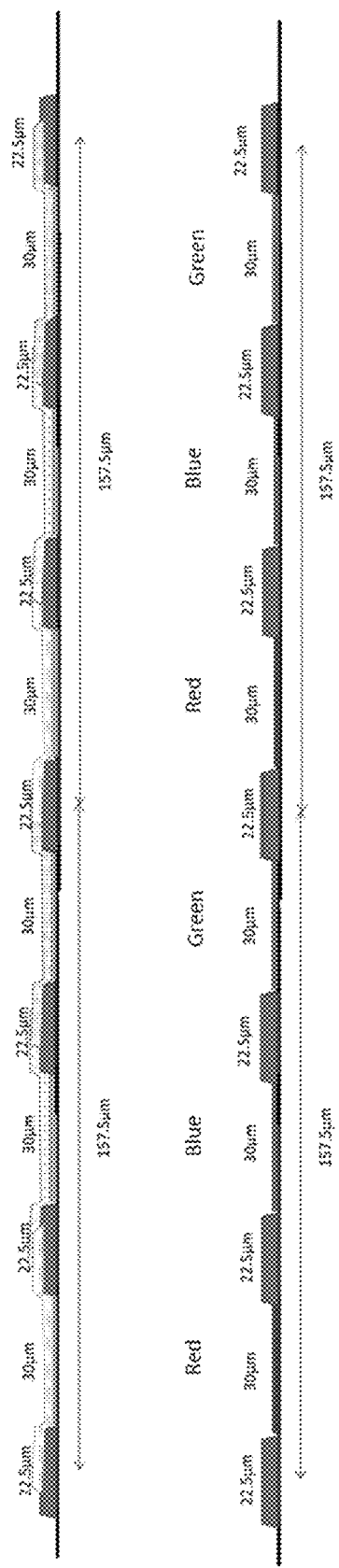
FIG. 10A shows the dimensions of a conventional 55" 4K display panel pixel design.

As a specific example, the improvement in resolution provided by this technique may be seen by considering an OVJP print distribution profile that is appropriate for a 65" 8K display. The flat region of the distribution is 30 μm wide and the sloped sidewalls are 20 μm wide as shown in FIG. 5B. In this example, the PDL width is 22.5 μm wide (such as shown in FIG. 10A). The size of the distribution is shown for illustration only and should not be taken as limiting the ultimate resolution of the technique. FIG. 6A shows how red, blue and green distributions can be overlapped on the non-emissive insulating PDL material 602, 603, 604, 605 as previously described with respect to FIG. 5B. For example, the central two portions 603, 604 of the non-emissive insulating PDL may be coated with red and blue OLED material or blue and green material, respectively. The outer portions 602, 605 may be coated with red and green OLED material, respectively. When the arrangement is repeated across a display panel, generally interior portions of the non-emissive insulating material may be coated by OLED material ejected by multiple OVJP print heads, and only the outermost regions may be coated by material ejected by only one OVJP print head. The blue deposition 610 is exaggerated related to the others for ease of illustration. As shown, the blue deposition extends across two of the PDL areas 603, 604 and may cover, be covered by, or be mixed with the red and green OLED depositions in the areas over the middle PDL regions 603, 604. For example, the PDL region 603 may have a mixed red and blue OLED material layer when the red and blue print heads are operated concurrently. Similar effects may occur in any of the techniques disclosed herein, such that non-emissive portions of a display panel may have one or more OLED depositions over them without affecting the operation of the panel in order to achieve the efficiency and other advantages disclosed herein.

Figure 6B:
FIG. 6B shows a cross section view of the pixel depositions showing the topology of the deposition shown in FIG. 6A.

FIG. 6B shows the resulting OLED material deposition profiles in a cross section of the display backplane. The figure is not to scale and the OVJP deposition thickness is also exaggerated for clarity. Typical thickness for the non-emissive insulating PDL layer is on the order of 1000 nm, while the OLED depositions typically are in the range of 50 nm to 100 nm. As described with respect to FIG. 6A, it can be seen that material ejected by one or more OVJP print heads may be deposited over the PDL layer, while material from only one OVJP print head is deposited over the active emissive pixel regions between the PDL material.

Figure 7A:
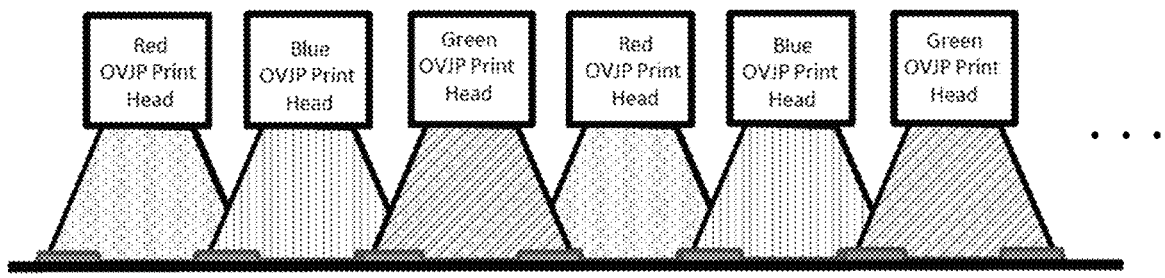
FIG. 7A shows red, green and blue print heads depositing OLED emissive material on a display backplane as disclosed herein.
Figure 7B:
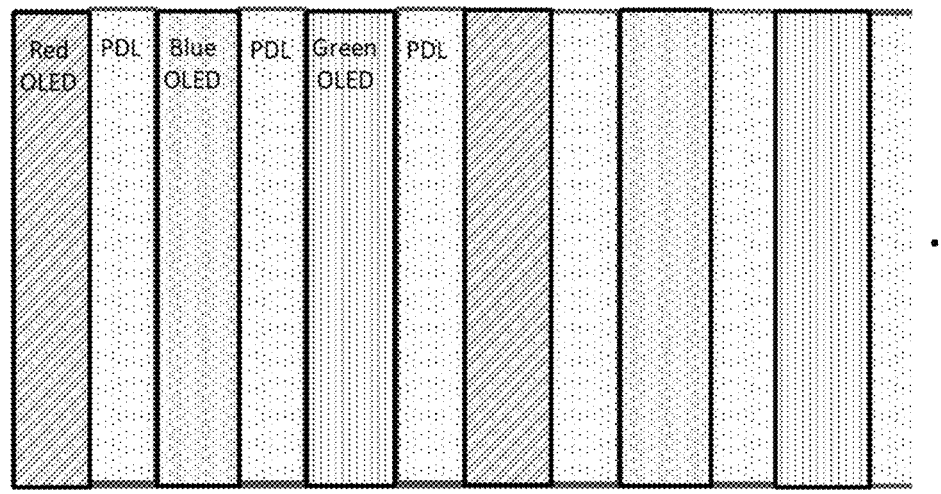
FIG. 7B shows the arrangement of printed lines and parallel pixel-separating grid lines formed by the non-emissive insulating material resulting from the deposition in FIG. 7A as disclosed herein.

FIG. 6A shows three OVJP print heads, with one print head used for each red, green, or blue emissive material. More generally, a similar arrangement may be extended to include more OVJP print heads. For example, the same red/green/blue arrangement may be repeated across an active display area, or additional or different materials may be used. FIG. 7A shows a similar configuration that includes a line of OVJP print heads relative to a display backplane during deposition. In this example, the red/green/blue arrangement of FIG. 6A is repeated across the active area of a display being fabricated over a backplane as previously disclosed. FIG. 7B shows a top-down view of the resulting printed lines on the display panel and the stripes of the non-emissive insulating PDL material stripes arranged parallel to the printing direction. (For clarity purposes, the horizontal PDL structures are not shown).

Figure 8A:
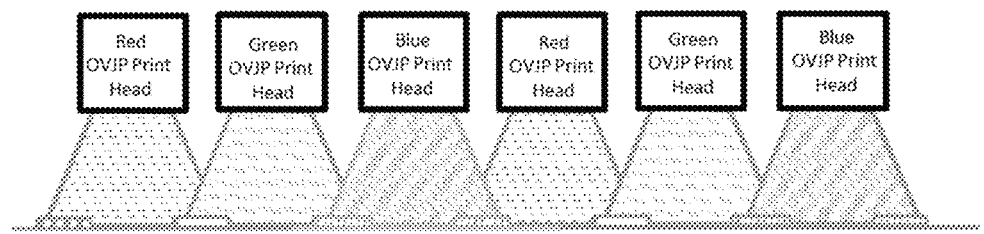
FIGS. 8A and 8B show the pixel arrangement resulting from a deposition as shown in FIG. 7A and resulting deposition as in 7B, respectively, when a non-emissive insulating grid is used as disclosed herein.
Figure 8B:
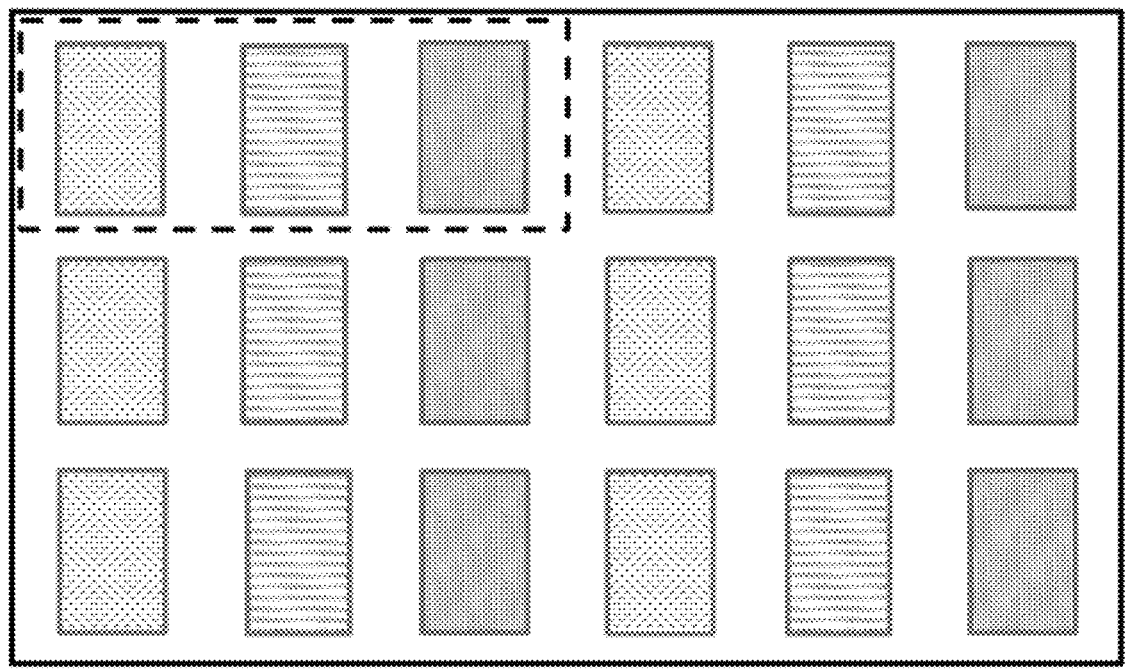

FIGS. 8A and 8B show a similar example that includes the horizontal PDL structure. FIG. 8A shows an alternative arrangement of red/green/blue OVJP print heads compared to FIG. 7A. More generally, any arrangement of print heads may be used to achieve the desired relative placement of emissive regions on the display panel. FIG. 8B shows the resulting pixel structure as viewed from above the display panel substrate, where similar hashing in sub-pixels indicate the same emissive material or color, corresponding to the OVJP print heads shown in FIG. 8A. Such a structure may be used, for example, to fabricate side-by-side RGB-type pixels. In this example, a single pixel formed from three sub-pixels deposited between the PDL material is shown by the dashed outline. As shown by this arrangement and similarly to the other examples provided herein, the resolution and fill factor of the display panel may be adjusted by adjusting the horizontal and vertical widths of the emissive pixel regions and the non-emissive PDL regions without the need to adjust the OVJP print heads themselves, as long as the deposition profile of the print heads does not extend completely over a PDL region such that material from a single print head is deposited over two emissive pixel areas.

Figure 9A:
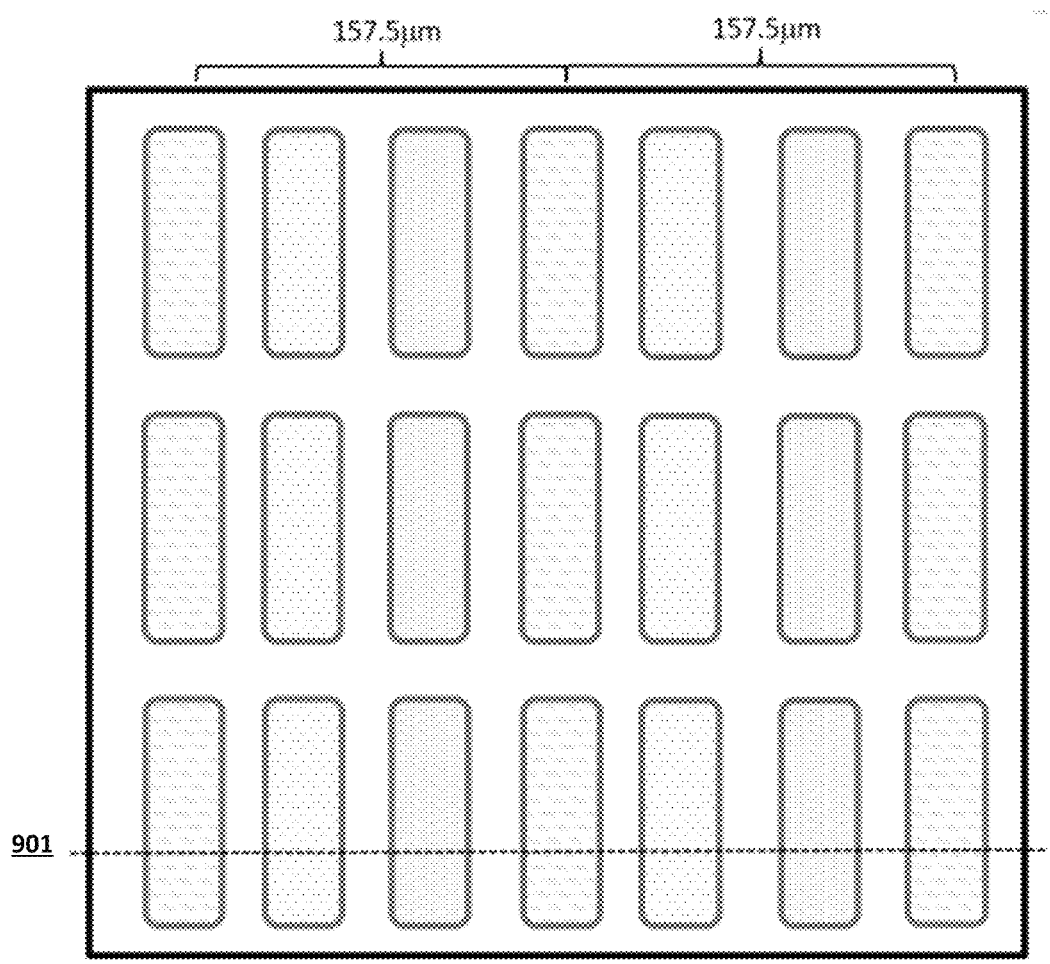
FIG. 9A shows an OVJP display pixel arrangement as disclosed herein in which OVJP print heads are used to print continuous lines across both active sub-pixel areas and non-emissive insulating PDL areas.
Figure 9B:
FIG. 9B shows the corresponding cross-section thickness profile taken across the reference line as shown.

FIG. 9A shows a pixel layout and illustrative dimensions as disclosed herein, for a red/blue/green repeating pixel arrangement. FIG. 9B shows a schematic cross section of the same display panel taken through line 901. As previously disclosed, the anodes contain the flat section of the flux distribution and the PDL contains the sloped sidewall distribution form the print heads. In this arrangement, each sub-pixel contains one individually addressable anode corresponding to an individual sub-pixel.

Figure 9C:
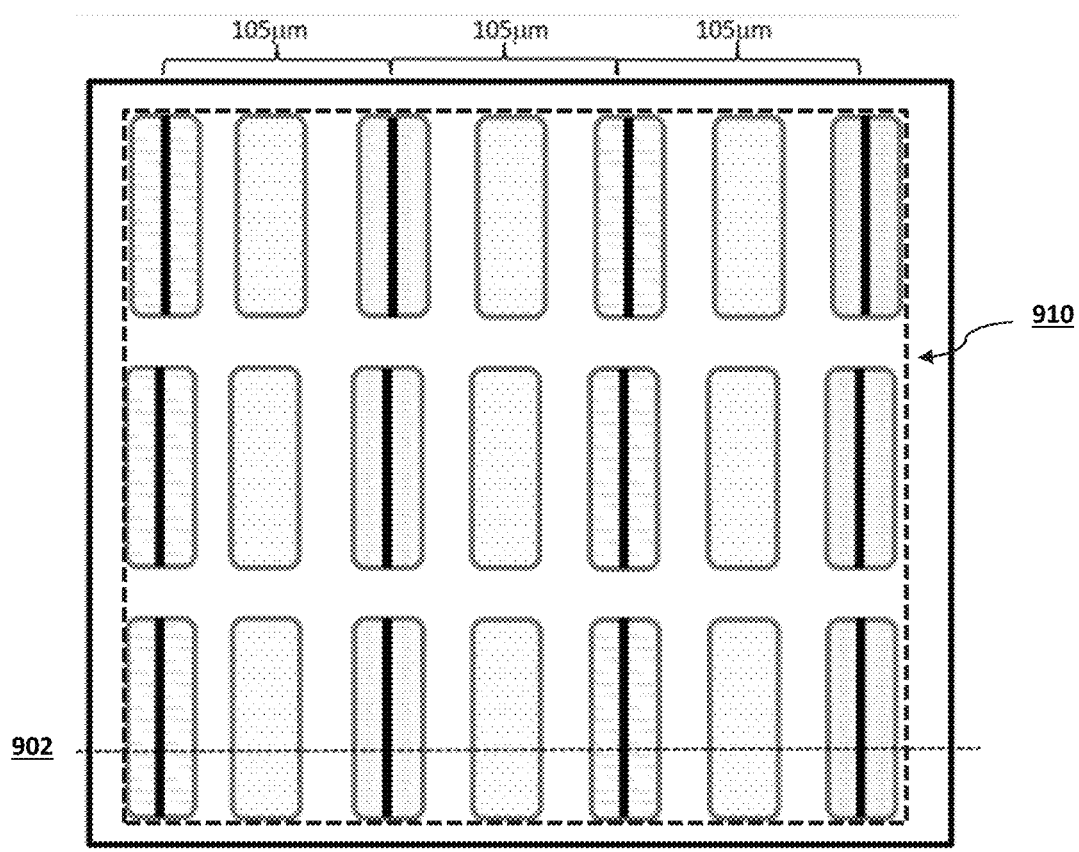
FIG. 9C shows an OVJP display pixel arrangement similar to FIG. 9A, where pixel anode splitting is used to increase the resolution of the panel in comparison to the arrangement of FIG. 9A as disclosed herein.
Figure 9D:
FIG. 9D shows the associated cross-section thickness profile taken across the indicated reference line.

FIG. 9C shows a display panel with a backplane design that increases pixel density by splitting the red and green pixel regions and depositions in half, to form two sub-pixels in each active sub-pixel region, i.e., the region between the PDL for the respective OLED depositions. Each half of the red and green sub-pixel is individually addressable by modifying the backplane, but each color is printed with one pass of the OVJP print head. Notably, although the printing resolution of the OVJP print head is not changed from the design used in FIG. 9A, the pixel size is reduced from 157.5 μm to 105 μm. The OVJP deposition profile is also unchanged from that shown in FIG. 9A, but the repeating pattern of the display changes form R-B-G-R-B-G . . . to R-R-B-G-G-B-R-R-B-G-G, and the arrangement of OVJP print heads is changed from red-blue-green-red-blue-green to red-blue-green-blue-red-blue-green-blue. FIG. 9D shows the cross-section of the display panel in FIG. 9C taken across line 902.

Figure 10B:
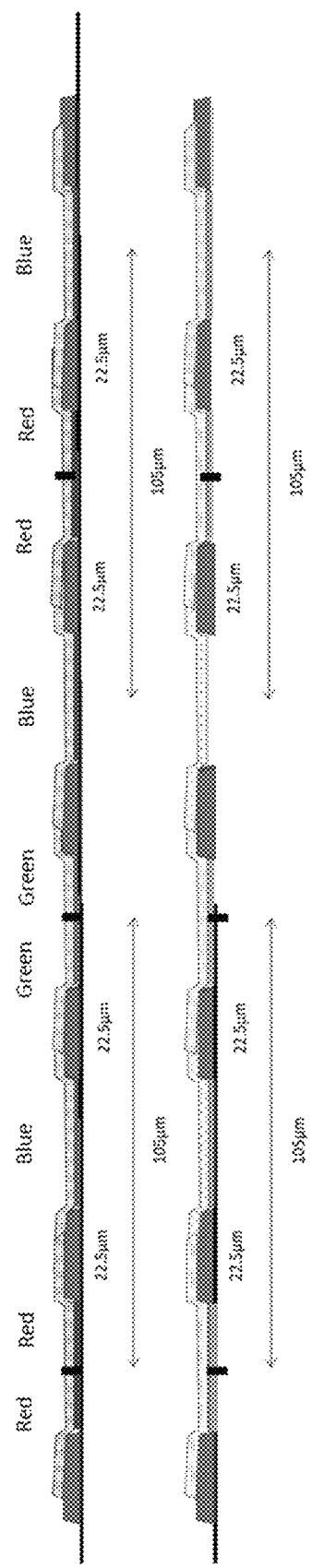
FIG. 10B shows a corresponding display panel when with increased resolution resulting from splitting the red and green anodes as disclosed herein.

FIGS. 10A and 10B show cross-section views of the pixel configurations in FIGS. 9A and 9C, respectively. FIG. 10A shows the standard R-B-G-R-B-G configuration with a pixel pitch of 157.5 μm or 161 pixels per inch (ppi). Splitting the red and green pixels as previously disclosed reduces the pixel spacing in this example to 105 μm and increase the pixel density to 242 ppi as shown in FIG. 10B.

Figure 11A:
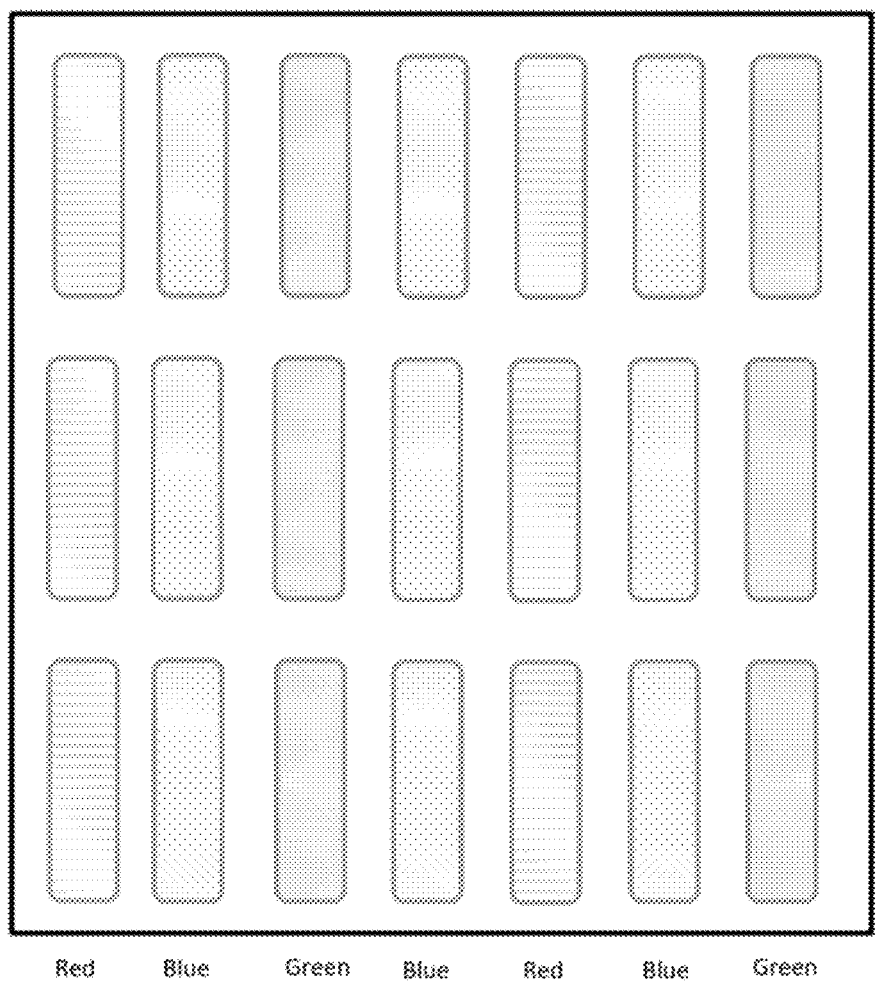
FIG. 11A shows a conventional OVJP printed pixel design.
Figure 11B:
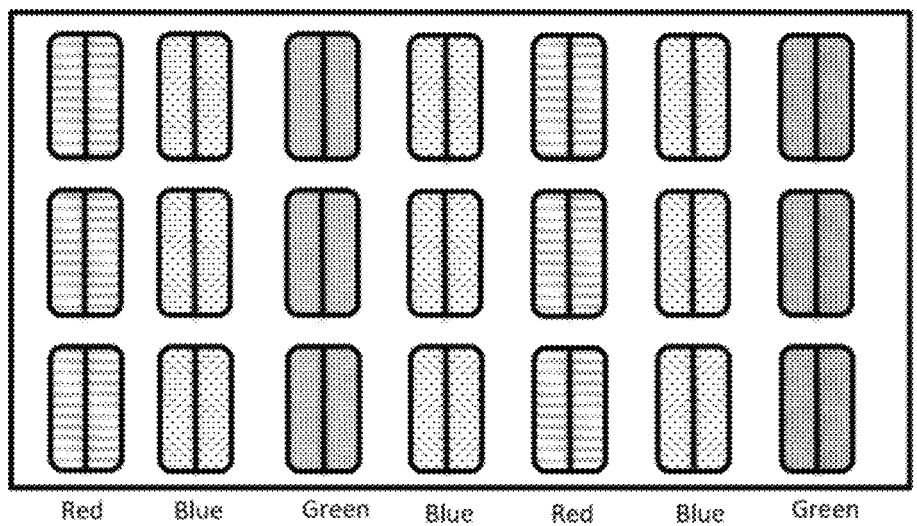
FIG. 11B shows a split pixel design as disclosed herein, in which the horizontal resolution is improved by pixel splitting and the vertical resolution is improved by decreasing the spacing of horizontal PDL lines.

An additional benefit of the split pixel design such as shown in FIGS. 9C, 9D, and 10B is that the active area of the blue pixel is double the area of the split red or green pixels. FIG. 11 shows that the pixel spacing in the vertical direction may be increased by reducing the distance between horizontal PDL stripes and adjusting the anode and drive electronics accordingly. To illustrate this, the pixel spacing in FIG. 11B is reduced by one-half compared to the example in FIG. 11A and the pixel density (ppi) in the vertical direction is increased accordingly. Notably, doubling the pixel density according to the techniques disclosed herein does not require any change to the OVJP process itself. In contrast, for VTE and similar fabrication techniques that use a fine metal mask or other masking layer, the production and alignment of the mask would be more complex and costly as the pixel density was increased.

The previous examples demonstrate pixel designs that are achieved by printing along the vertical direction of the display edge. That is, in these examples the OVJP print heads are moved from "top" to "bottom" across the display active areas as shown, printing continuous lines that extend across both the active pixel areas and the non-emissive insulating PDL material as previously disclosed. The same results may be achieved by printing horizontally across the display active area.

Figure 12:
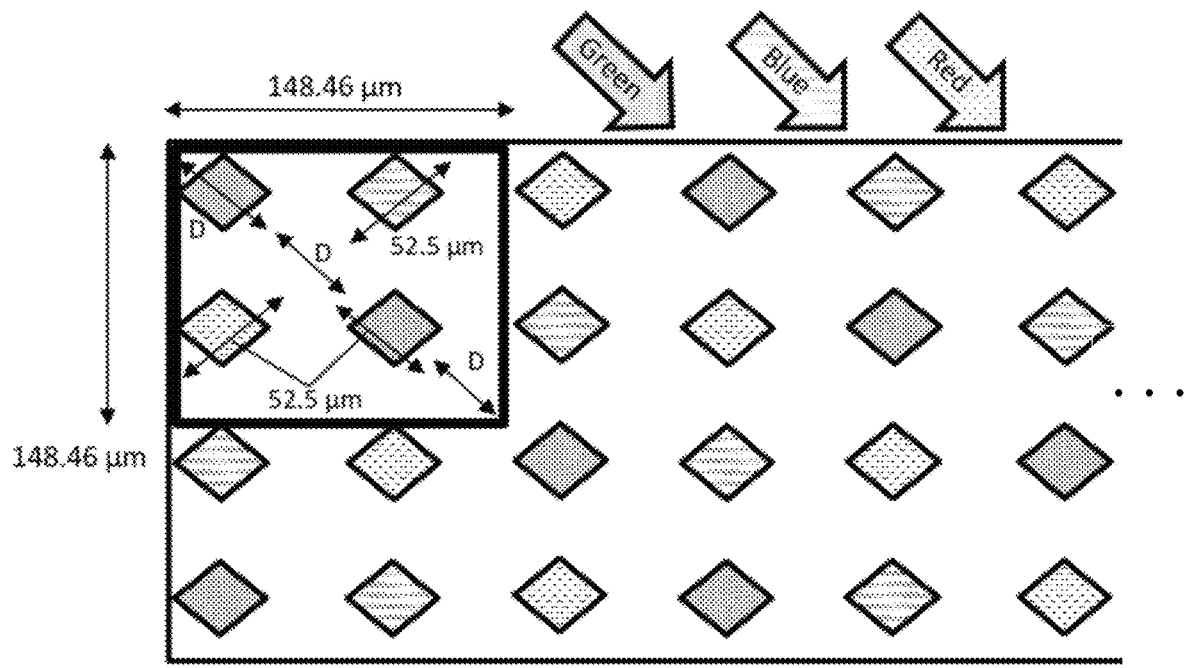
FIG. 12 shows example pixel arrangement as disclosed herein, which may be achieved by printing lines at 45 degrees relatively to a vertical axis of the display and printing every third line with a green emitter material.

It is also possible to print in a direction that is 45 degrees off the direction of the display edge instead of parallel to one edge of the display active area or another. FIG. 12 shows an alternate backplane design embodiment that increases pixel resolution by printing at 45 degrees to the vertical edge of the display. In this example, red, green and blue lines alternate across the display. Columns are rotated 45 degrees from the horizontal and vertical edges of the display. As shown in the upper left corner of FIG. 12, a pixel pitch distance of 148.46 µm may be achieved as expressed by Equation 1 below, in which D is the line space, 52.5 µm is line width also used for the examples printed parallel to the vertical display axis. Use of this patterning in the pixel design may improve the display resolution from original 161 to 170 ppi. Furthermore, if D is smaller than 52.5 µm, the display resolution will be higher than 170 ppi. Using the techniques and arrangements disclosed herein, D distances in the range of 30, 35, 40, 45, 50, 55, 60 µm, or any intervening distance may be achieved.

$$V \& H: \text{Pixel pitch} = \frac{(52.5 \times 2 + 2D)}{\sqrt{2}} = 148.46 \ \mu m \qquad \text{Equation 1}$$

As: $D = 52.5 \ \mu m$

Figure 13:
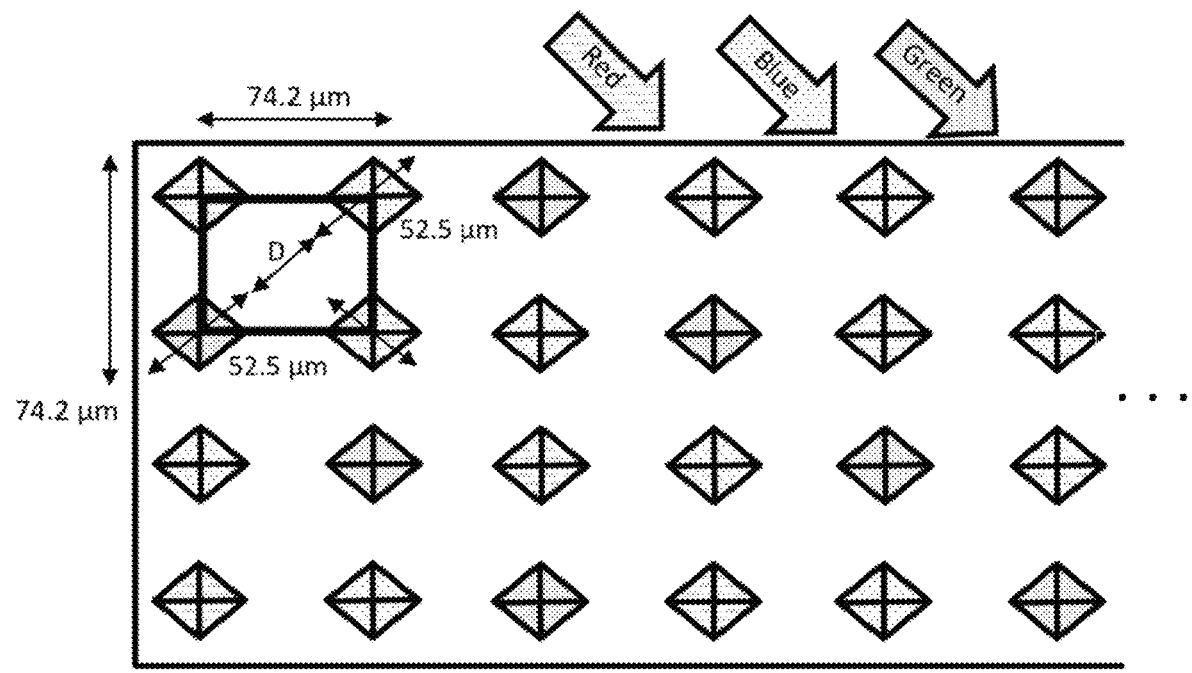
FIG. 13 shows a pixel arrangement as disclosed herein, in which alternating R-G-B lines are printed at 45 degrees relative to the display vertical axis and the sub-pixel anodes are split into 4 individually addressable regions.

Off-angle printing as shown in FIG. 12 also may be used in conjunction with pixel splitting techniques as previously disclosed. FIG. 13 shows an alternate backplane design in which alternating red, green and blue lines are printed at 45 degree angle relative to the display active area edge, and each sub-pixel is further divided by PDL and backplane electronics into 4 individually addressable sub-pixels. As shown in the upper left corner, pitch pixels distance of 74.2 µm may be achieved through pixel splitting as expressed by Equation 2, in which D is the line space and 52.5 µm is the line width. Applying this patterning to pixel design will improve the display resolution in this example from original 161 to 342 ppi, resolution. More generally, such techniques may achieve pixel resolution of at least 342 ppi.

$$H \& V: \text{Pixel pitch} = \frac{(52.5 + D)}{\sqrt{2}} = 74.2 \ \mu m \qquad \text{Equation 2}$$

As $D = 52.5 \ \mu m$

Figure 14:
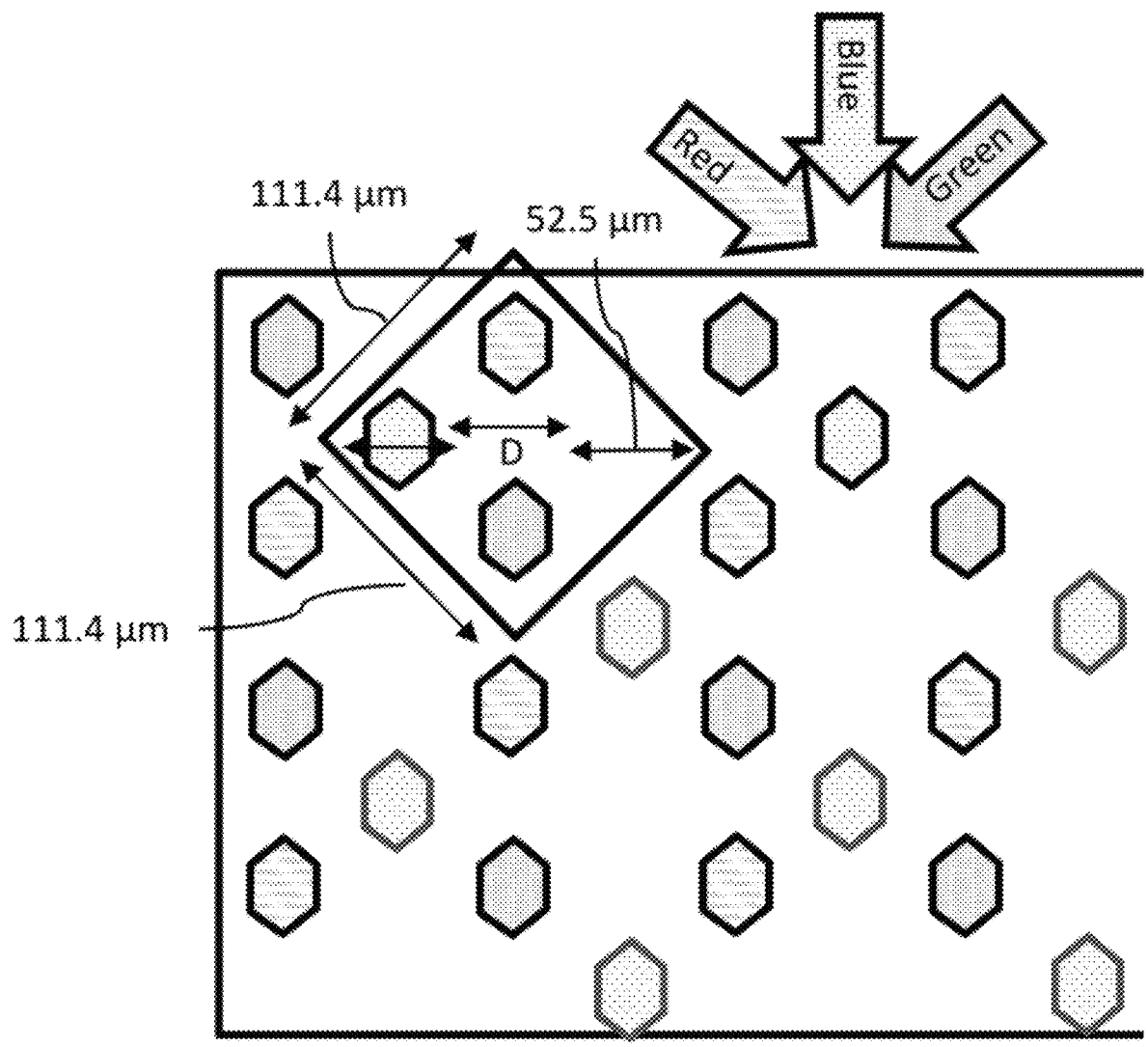
FIG. 14 is a diagram illustrating a pixel arrangement as disclosed herein, in which blue lines are printed parallel to the vertical display axis and red and green lines are printed at a 45 degree angle to the vertical axis.

The pixel resolution may be further increased by printing different color lines at different angles, as shown in FIG. 14. In this example, blue lines are printed parallel to the vertical axis in every other column. The red lines are printed along at a negative 45 degree angle from the blue line direction and printed every 4th line. The green lines are printed at a positive 45 degree angle from the blue line direction and printed every 4th column, and offset from the red line by a blue column. As shown in the upper left corner, a pixel pitch distance of 111.4 µm may be achieved as expressed by Equation 3, in which D is the line space and 52.5 µm is line width. Applying this patterning to pixel design will improve display resolution from original 161 to 228 ppi, resolution. More generally, pixel resolutions of at least 228 ppi may be achieved using such a technique.

$$H \& V: \text{Pixel pitch} = \frac{(52.5 \times 2 + D)}{\sqrt{2}} = 111.4 \ \mu m \qquad \text{Equation 3}$$

As $D = 52.5 \ \mu m$

Figure 15A:
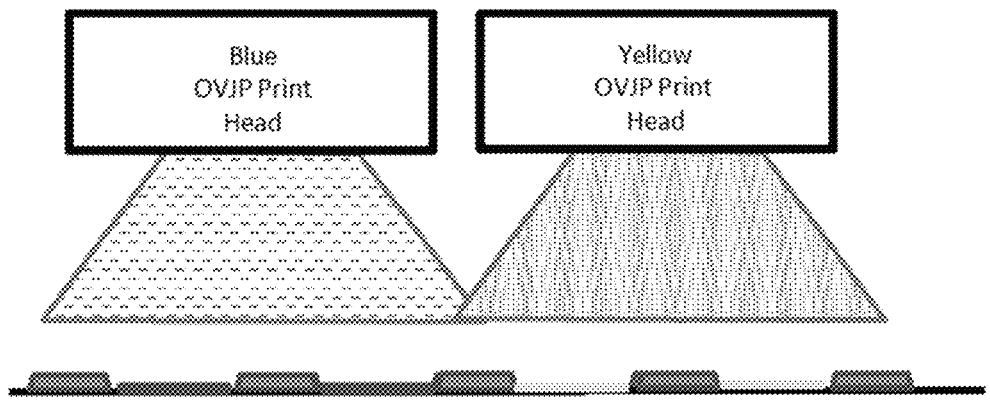
FIG. 15A shows an arrangement of blue and yellow OVJP print heads with a blue-plus-yellow backplane as disclosed herein.

As previously disclosed, various numbers of OVJP print heads may be used in conjunction with the techniques disclosed herein. Although previous examples used repeating patterns of three OVJP print heads, more or fewer print heads may be used. FIG. 15A shows a pixel and backplane design that uses deposition of only two OLED colors to produce R-G-B displays. In this example, blue and yellow emitters are deposited on the substrate via two or more OVJP print heads. Red and green emission may be produced from the yellow emission through the use of color filters, cavity designs, and/or phosphors. The yellow pixel may be split into two individually addressable areas, each of which may be used for red or green emission. In this example, the material deposited by each color of print head may extend across multiple pixel active regions and/or multiple non-emissive insulating PDL areas as shown. In some cases, no pixel active region may have a deposition of both colors, such that each pixel active area only emits yellow or blue light initially (which may be further modified through the use of color filters or other color altering components). Alternatively, both emissive colors may be deposited over some pixel active areas, such as where white sub-pixels are desired in addition to single-color sub-pixels.

Figure 15B:
FIG. 15b shows an example placement of color converting layers to convert yellow emissive material to red and green emission as disclosed herein.
Figure 15C:
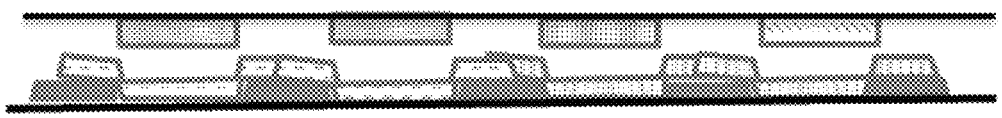
FIG. 15 C shows an example of placement of color conversion layers in a cover glass as disclosed herein.

FIG. 15A shows how the blue and yellow distributions can be overlapped on the portion of the PDL that separates the yellow and blue depositions. FIGS. 15B and 15C show the resulting OLED material deposition profiles in a cross section of the display backplane and increased pixel density by splitting the blue and yellow pixels in half. The yellow emission may be converted to red and/or green by using color filters in this example. Both halves of yellow printed line may be deposited simultaneously using one OVJP print aperture as shown in FIG. 15A, and may be divided into two subpixels with red and green color filters respectively by modifying the backplane or cover glass. FIG. 15B shows an example of a bottom-emitting display panel with color filter below or incorporated into the substrate FIG. 15C shows a top emission display with color filters disposed on a cover glass.

Figure 16A:
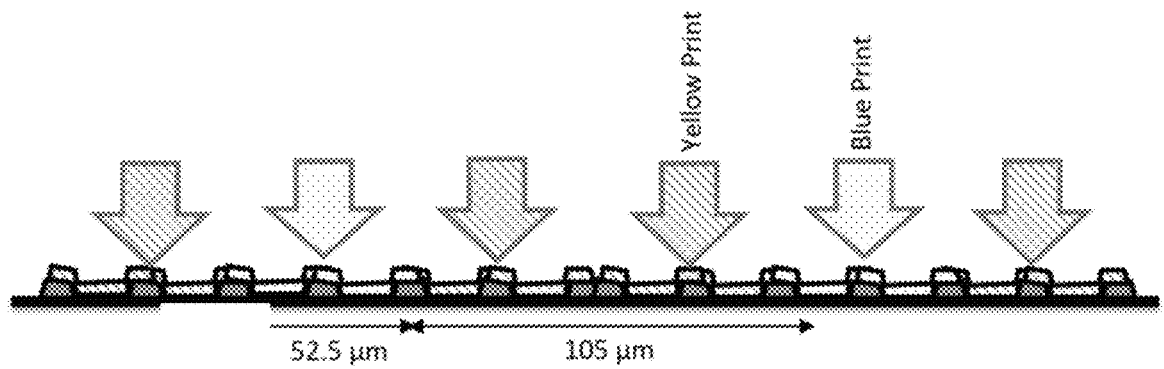
FIGS. 16A and 16B show, respectively, an arrangement for printing blue and yellow lines by OVJP over multiple sub-pixels and the resulting pixel arrangement as disclosed herein, in which each printed line is split into multiple sub-pixels. In this example, blue lines are split into two blue sub-pixels and yellow lines are split into two green and two red sub-pixels.
Figure 16B:
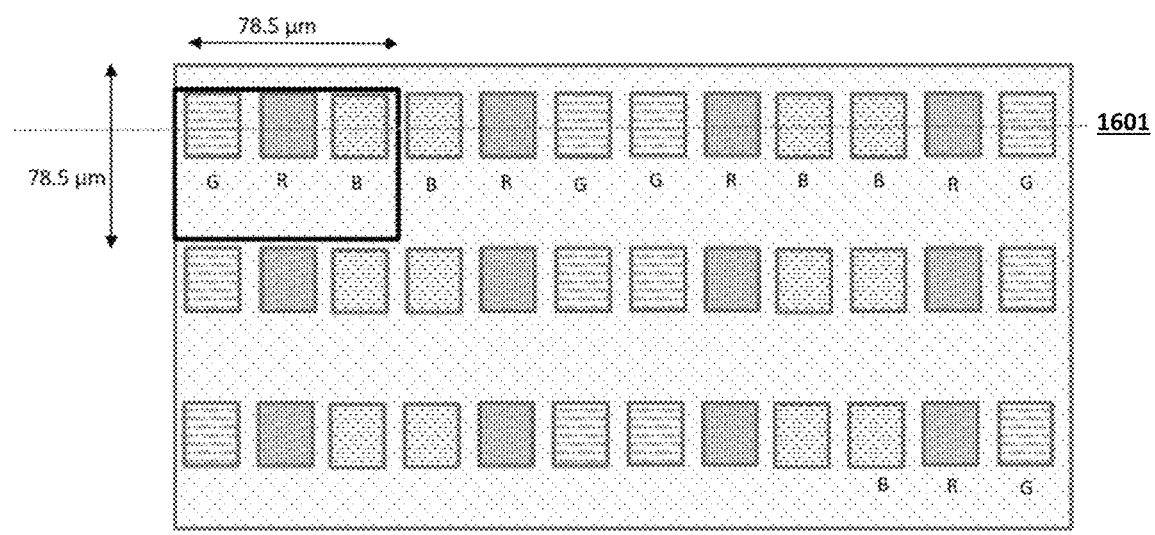

FIGS. 16A and 16B show a similar arrangement with a backplane design which increases pixel resolution using blue and yellow pixels with color conversion of yellow to produce red and green light. In this example, the blue line is deposited into two rows of subpixels with one print pass (e.g., 52.5 µm wide). The yellow line is deposited into four rows of subpixels with one print pass (e.g., 105 µm wide), and also uses color filters to generate G-R-R-G sub-pixels. FIG. 16A shows a cross section of the display panel taken through the line 1601 in FIG. 16B and shows the G-R-B-B-R-G-G-R-B-B-R-G configuration with pixel pitch distance of 78.5 µm as expressed by Equation 4. Applying this patterning to pixel design may improve display resolution from original 161 ppi to 323 ppi.

$$\text{Pixel pitches} = \frac{52.5 \times 3}{2} = 78.5 \ \mu m \qquad \text{Equation 4}$$

Figure 17:
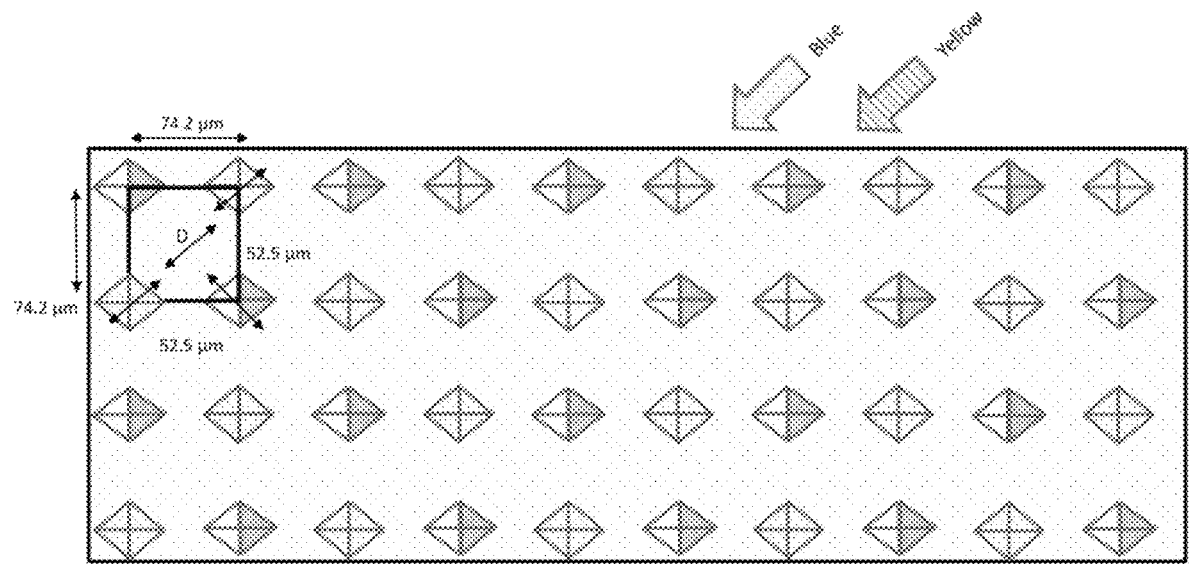
FIG. 17 shows a blue-plus-yellow OVJP configuration as disclosed herein, in which each printed pixel is split into four individually-addressable segments to produce a higher pixel resolution. In this example, yellow pixels are split into two red and two green sub-pixels and blue pixels are split into four blue sub-pixels.

Off-angle and pixel splitting techniques as previously disclosed for three OVJP depositions also may be used when two colors of OVJP depositions are used. FIG. 17 shows an arrangement and backplane design for two-color deposition that increases pixel resolution through pixel splitting as previously disclosed. In this example, yellow and blue lines are printed at 45 degrees to the vertical and horizontal display edges and alternate in a Y-B-Y-B pattern. All pixels deposited by the blue OVJP print lines are divided by PDL into four sub-pixels. Similarly, all pixels patterned by the yellow OVJP lines are also divided by the PDL into four sub-pixels, and these subpixels are further patterned with red and green color filters. As shown in the upper left corner, a pixel pitch distance of 74.2 μm may be achieved through pixel splitting as expressed by equation 5, in which the line space D=52.5 μm, and 52.5 μm is line width. Applying this patterning to pixel design improves the display resolution from the original 161 to 342 ppi resolution.

$$H \& V: \text{Pixel pitch} = \frac{(52.5 + D)}{\sqrt{2}} = 74.2\ \mu m \quad \text{Equation 5}$$

As $D = 52.5\ \mu m$

As used herein, the "active display portion" of a substrate refers to the smallest rectangular area having sides parallel to those of the display panel being fabricated, which encompasses all active regions of the display panel. For example, the dotted rectangle 910 in FIG. 9C indicates the active display portion of the panel shown. Notably, in all the arrangements and techniques previously disclosed herein, the OVJP print heads may be operated such that they deposit the OLED materials, including the emissive organic materials, in continuous lines from one edge of an active display portion of the panel or substrate to another. For example, in FIGS. 4B, 4C, 7B, 8B, 9A, 9B, 11A, and 11B, the OVJP print heads may be operated to deposit continuous lines of OLED material from the top of the illustrated active display portion to the bottom. Similarly, in the arrangements shown in FIGS. 12, 13, 14, 16, and 17, the OVJP print heads may be operated continuously from one edge of the active display portion of the panel to another edge, though the edges may not be parallel opposite edges of the panel. For example, the print heads may be moved from a left edge diagonally across the panel to the bottom edge, but still operating continuously and depositing the OLED material in a continuous line across the substrate. In contrast to conventional printing techniques, the print heads need not be started and stopped in between depositing in rows of sub-pixels. The continuous operation allow for more efficient fabrication, without the need to precisely align the OVJP print heads since the sidewall deposition is deposited over the non-emissive PDL material as previously disclosed. Furthermore, the OVJP techniques disclosed herein may be advantageous over blanket deposition techniques since they do not require fine metal masks or other masking components in order to deposit on the active sub-pixel areas.

Figure 18:
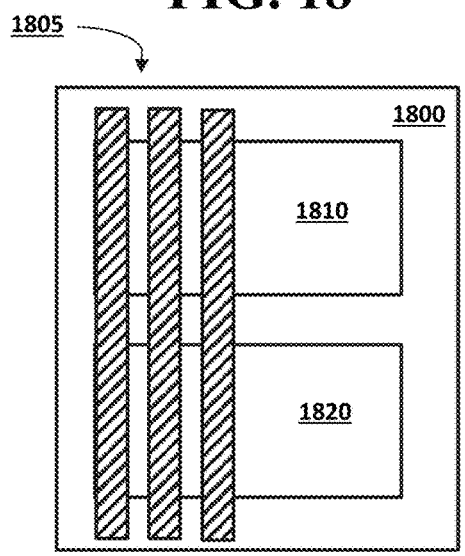
FIG. 18 shows a schematic representation of multiple panels fabricated on a single substrate as disclosed herein.

The techniques disclosed herein also may be used to print multiple display panels on a single substrate using a common set of OVJP print heads. For example, multiple panels may be arranged on a single substrate, across which the OVJP print heads may print continuous lines of OLED material, after which the substrate may be cut or otherwise separated into individual panels. FIG. 18 shows a schematic representation (not to scale) of a single substrate 1800 on which two display panels 1810, 1820 are fabricated. OVJP print heads may be used to deposit continuous lines of OLED material 1805 across both panels without interruption. Such an arrangement may be used with any of the techniques previously disclosed, including two- or three-color depositions, off-angle depositions, and the like. Display panels of any size and shape may be used, and the panels fabricated on a common substrate may have the same or different shape, aspect ratio, size, or any other physical parameter. Furthermore, in some embodiments a row or other array of OVJP print heads that extends across the entire substrate may be used, thereby allowing for efficient deposition over all panels on the substrate using continuous lines of OLED material as deposited by the OVJP print heads.

When used alone or in various combinations, the techniques disclosed herein may allow for much more efficient OVJP-based fabrication of high-resolution displays than may be achieved using convention OVJP and other techniques. Embodiments disclosed herein may achieve resolutions of 100, 120, 140, 160, 180, 200, 220, 240, 260, 280, 300, 320, 340, 360 ppi or higher, or any intervening or intermediate resolution. By adjusting the pixel separation in one direction and the OVJP print head spacing in the other, and/or by using off-angle deposition techniques, any such desired resolution may be achieved.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of fabricating a display, wherein the display comprises a full-color organic light emitting diode (OLED) display, the method comprising:
    obtaining a substrate having a non-emissive insulating layer that defines active pixel areas on the substrate; and
    depositing, via a first organic vapor jet printing (OVJP) print head, a first organic emissive material over the substrate in a continuous line extending from a first edge of an active display portion of the substrate to a second edge of the active display portion of the substrate and being deposited over at least a portion of the non-emissive insulating layer and over at least a first portion of the active pixel areas; and
    depositing, via the first OVJP print head or a second OVJP print head, a second organic emissive material different than the first organic emissive material in a continuous line extending from the first edge of the active display portion of the substrate to the second edge of the active display portion of the substrate and over at least the portion of the non-emissive insulating layer that is the same as the portion over which the first organic emissive material is deposited, and over at least a second portion of the active pixel areas that is different than the first portion.

2. The method of claim 1, wherein the continuous lines in which each of the first and second emissive materials are deposited are parallel to an edge of the display.

3. The method of claim 1, further comprising:
    depositing, via the first OVJP print head, the second OVJP print head, or a third OVJP print head, a third organic emissive material different than the first and second organic emissive materials in a continuous line extending from the first edge of the active display area of the substrate to the second edge of the active display area of the substrate and over at least the portion of the non-emissive insulating layer that is the same as the portion over which at least one of the first and second organic emissive materials is deposited, and over at least a third portion of the active pixel areas that is different than the first and second portions.

4. The method of claim 3, wherein at least one of the organic emissive materials is deposited in a line oriented at a 45 degree angle relative to an edge of the display.

5. The method of claim 4, wherein at least one of the organic emissive materials is deposited in a line oriented at a −45 degree angle relative to the edge of the display.

6. The method of claim 5, wherein a line of pixels oriented at the 45 degree angle has twice the density as a line of pixels oriented parallel to the edge of the display.

7. The method of claim 6, wherein the display comprises the same number of sub-pixels of each of three colors, each of the three colors provided by one of the first, second, or third organic emissive materials.

8. The method of claim 3, wherein at least one of the continuous lines in which the first, second, and/or third emissive materials are deposited is parallel to an edge of the display.

9. The method of claim 3, wherein regions of the second organic emissive material deposited over the active pixel areas are divided into two portions by the backplane to form two separately-addressable regions of the second organic emissive material.

10. The method of claim 9, wherein the continuous line of the third organic emissive material is disposed between the continuous lines of the first and second organic emissive materials.

11. The method of claim 1, wherein the continuous lines of the first and second organic emissive materials are not the same width.

12. The method of claim 11, wherein the first organic emissive material comprises a blue-emitting material and the second organic emissive material comprises a yellow-emitting material.

13. The method of claim 1, wherein regions of the first organic emissive material deposited over the active pixel areas are divided into two portions by a backplane to form two separately-addressable regions of the first organic emissive material.

14. The method of claim 1, wherein the continuous line of the first organic emissive material extends across two active display portions of the substrate, each corresponding to a separate display panel on a common substrate.

15. The method of claim 14, further comprising separating the common substrate to form multiple display panels.

16. A consumer electronic device comprising a display panel fabricated according to the method of claim 1.

17. The consumer electronic device of claim 16, wherein the consumer electronic device is at least one type selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display having an active area with a primary diagonal of 2 inches or less, a three-dimensional (3-D) display, a virtual reality or augmented reality display, a vehicle, a video wall comprising multiple displays tiled together, a theater or stadium screen, and a sign.

18. An organic light emitting diode (OLED) display device comprising:
    a substrate;
    a non-emissive insulating layer disposed over the substrate that defines active pixel areas on the substrate;
    a first organic emissive material disposed over the substrate in a continuous line extending from a first edge of an active display portion of the substrate to a second edge of the active display portion of the substrate and being deposited over at least a portion of the non-emissive insulating layer and over at least a first portion of the active pixel areas; and
    a second organic emissive material different than the first organic emissive material disposed in a continuous line extending from the first edge of the active display portion of the substrate to the second edge of the active display portion of the substrate and over at least the portion of the non-emissive insulating layer that is the same as the portion over which the first organic emissive material is deposited, and over at least a second portion of the active pixel areas that is different than the first portion.

19. The OLED display device of claim 18, wherein the active display portion has a resolution of at least 100 ppi.

20. The OLED display device of claim 18, wherein the active display portion has a resolution of at least 360 ppi.

* * * * *